United States Patent [19]
Semba

[11] Patent Number: 5,854,953
[45] Date of Patent: Dec. 29, 1998

[54] METHOD FOR DEVELOPING TREATMENT

[75] Inventor: Norio Semba, Kumamoto, Japan

[73] Assignee: Tokyo Electron Limited, Tokyo, Japan

[21] Appl. No.: 852,698

[22] Filed: May 7, 1997

[30] Foreign Application Priority Data

May 8, 1996 [JP] Japan ................................. 8-113772
Apr. 24, 1997 [JP] Japan ................................. 9-107167

[51] Int. Cl.⁶ ........................... G03D 5/04; B08B 3/02
[52] U.S. Cl. ..................... 396/611; 396/627; 134/902
[58] Field of Search .................................. 396/611, 625, 396/626, 627; 134/3, 153, 902

[56] References Cited

U.S. PATENT DOCUMENTS 4,564,280  1/1986  Fukada ................................. 396/627
5,487,398  1/1996  Ohmi et al. ........................... 134/902
5,555,234  9/1996  Sugimoto .............................. 396/611

*Primary Examiner*—A. A. Mathews
*Attorney, Agent, or Firm*—Oblon, Spivak, McClelland, Maier & Neustadt, P.C.

[57] ABSTRACT

The present invention provides a method for developing treatment, in which a developing solution is supplied to an object to be treated for performing a developing treatment, comprising the steps of supplying pure water onto a surface of said treating object for forming a pure water film on the surface of the treating object, and supplying a developing solution onto the surface of the treating object having the pure water film formed thereon in the preceding step. The particular method of the present invention permits markedly suppressing a defective development.

18 Claims, 10 Drawing Sheets

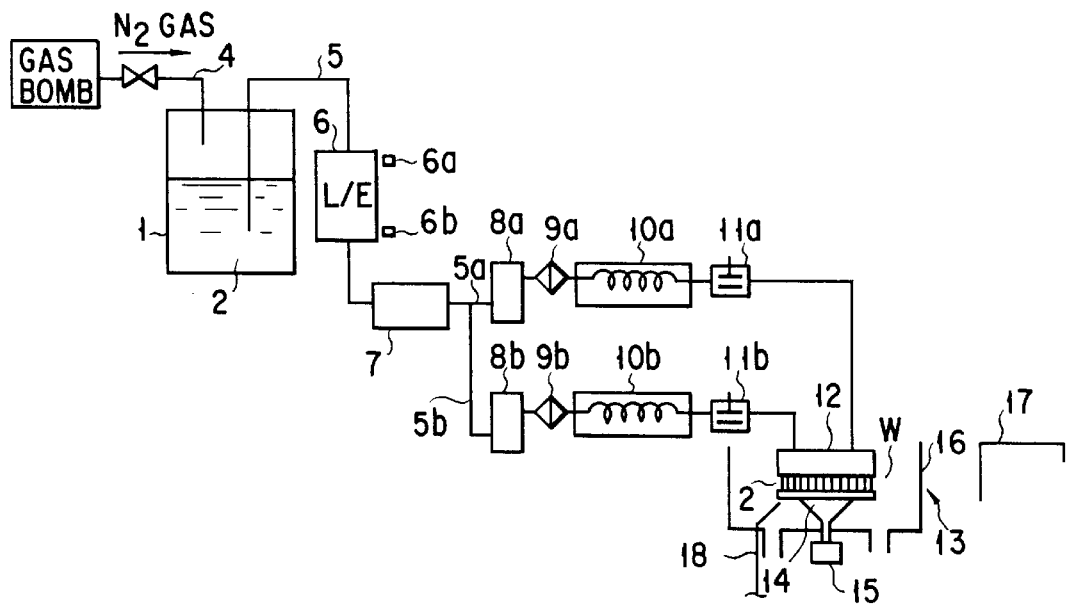
F I G. 2
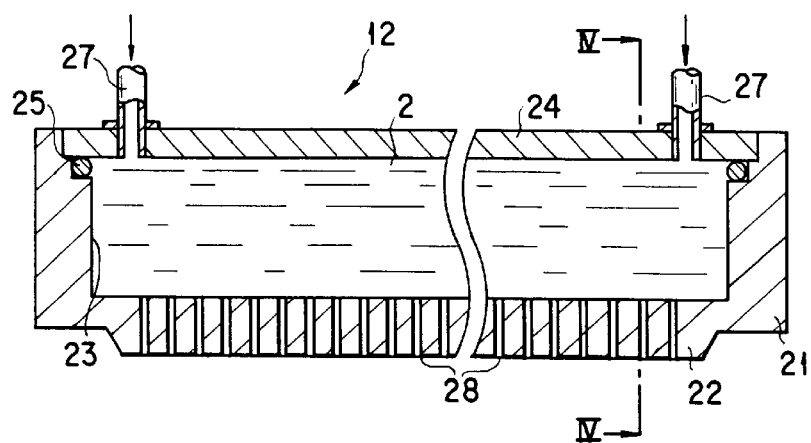
F I G. 3

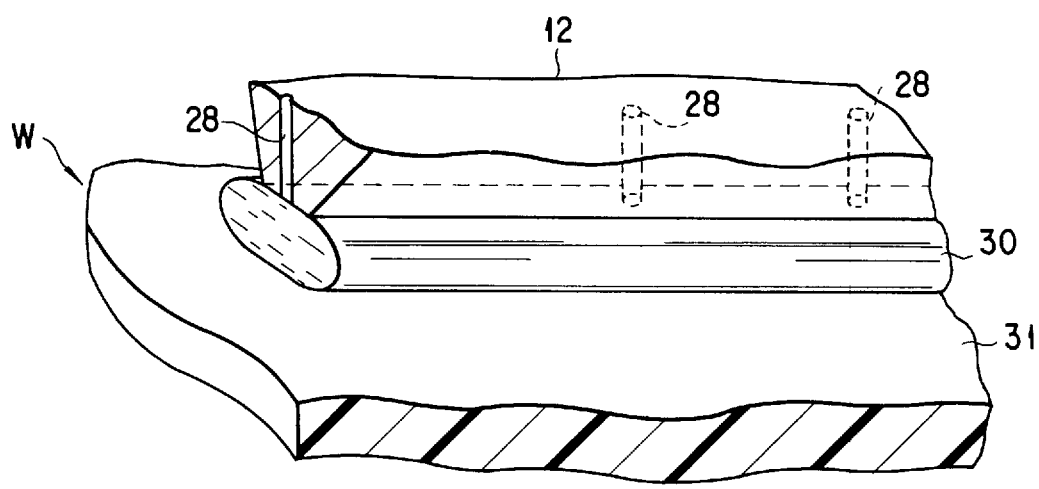
F I G. 7

5,854,953

METHOD FOR DEVELOPING TREATMENT

BACKGROUND OF THE INVENTION

The present invention relates to a method for developing treatment, in which, a treatment solution such as a developing solution, a photoresist solution, or the like is supplied onto, for example, a semiconductor wafer for the developing treatment.

In the manufacture of, for example, a semiconductor device, a semiconductor wafer is coated with a photoresist, followed by transferring a circuit pattern onto the photoresist by means of a photolithography technology and subsequently developing the transferred circuit pattern.

In the general developing treatment, a developing solution is supplied from a nozzle onto a semiconductor wafer. The developing solution is kept swollen or upheaved by its own surface tension on the wafer surface for a predetermined period of time so as to develop the circuit pattern.

Recently, a paddle type developing method is proposed for uniformly supplying a developing solution. Used in this method is a nozzle having a large number of liquid-supplying apertures arranged to form a straight line. While a developing solution is allowed to ooze out through these apertures, a semiconductor wafer which is to be coated with the developing solution is rotated at a low speed so as to spread the developing solution oozing onto the wafer surface over the entire surface of the wafer.

In the conventional method of developing treatment, a defective development tends to be caused by a first impact, i.e., impact given to a resist film by a developing solution when the developing solution is supplied first to the resist film formed on a semiconductor wafer. To be more specific, when a valve is opened for supplying a developing solution, the pressure is increased temporarily, with the result that the resist film is adversely affected as a first impact by the developing solution. For example, the development proceeds locally at the point of the first impact. In accordance with the recent trend toward a finer circuit pattern, the resist is required to exhibit a higher performance, i.e., a higher resolution. As a result, the first impact which was considered to be of no problem in the past has been found to bring about a defective development. However, an effective technique for suppressing the defective development in view of the first impact has not yet been established.

BRIEF SUMMARY OF THE INVENTION

An object of the present invention is to provide a method for developing treatment which permits markedly suppressing a defective development.

According to a first aspect of the present invention, there is provided a method for developing treatment, in which a treatment solution is supplied to an object to be treated for performing a developing treatment, comprising the steps of:

supplying pure water onto a surface of the treating object for forming a liquid film of a pure water on the surface of the treating object; and supplying a treatment solution onto the surface of the treating object having the liquid film of the pure water formed thereon in the preceding step.

According to a second aspect of the present invention, there is provided a method for developing treatment, in which a treatment solution is supplied to an object to be treated for performing a developing treatment, comprising the steps of:

bringing a nozzle for supplying a developing solution and pure water to a position in the vicinity of a surface of the treating object;

supplying pure water from the nozzle onto a surface of the treating object for forming a curtain of a pure water extending from the nozzle to reach the surface of the treating object; and supplying a treatment solution onto the surface of the treating object through the curtain of the pure water.

According to a third aspect of the present invention, a method for developing treatment in which a developing solution is supplied to an object to be treated for performing a developing treatment, using developing treatment apparatus comprising a nozzle for supplying the treatment solution and a pure water to the object to be treated, nozzle moving means for moving the nozzle between a first position as a starting point and a second position for supplying the treatment solution and the pure water to the object to be treated, treatment solution supply means for supplying the treatment solution to the nozzle, pure water supply means for supplying the pure water to the nozzle and control means for controlling the operation of the nozzle moving means, the treatment solution supply means and the pure water supply means, comprising the steps of the control means making the nozzle moving means move the nozzle from a first position to a second position in WAIT mode, the control means changing a control mode of the nozzle from a WAIT mode to a NON-WAIT mode, the control means making the pure water supply means supply the pure water to the nozzle to supply pure water from the nozzle onto the surface of the object to be treated so as to form a liquid film of a pure water on the surface of the object to be treated, and the control means making the treatment solution supply means supply the treatment solution to the nozzle to supply the treatment solution from the nozzle.

According to a forth aspect of the present invention, a method for developing treatment in which a developing solution is supplied to an object to be treated for performing a developing treatment using a developing treatment apparatus comprising a nozzle for supplying the treatment solution and a pure water to an object to be treated, nozzle moving means for moving the nozzle between a first position as a starting point and a second position for supplying the treatment solution and the pure water to the object to be treated, treatment solution supply means for supplying the treatment solution to the nozzle, pure water supply means for supplying the pure water to the nozzle and control means for controlling the operation of the nozzle moving means, the treatment solution supply means and the pure water supply means, comprising the steps of the control means making the nozzle moving means move the nozzle from a first position to a second position in WAIT mode, the control means changing a control mode of the nozzle from a WAIT mode to a NON-WAIT mode, the control means making the pure water supply means supply the pure water to the nozzle to supply pure water from the nozzle onto the surface of the object to be treated so as to form a curtain of a pure water between the surface of the object to be treated and the nozzle, and the control means making the treatment solution supply means supply the treatment solution to the nozzle to supply the treatment solution from the nozzle.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 schematically shows the system for the developing treatment included in the method of the present invention;

FIG. 3 is a cross sectional view showing the construction of a nozzle included in a developing device used for working the method of the present invention;

FIG. 7 schematically shows how pure water is supplied from the nozzle shown in FIG. 3 onto a surface of a semiconductor wafer;

DETAILED DESCRIPTION OF THE INVENTION

Figure 1:
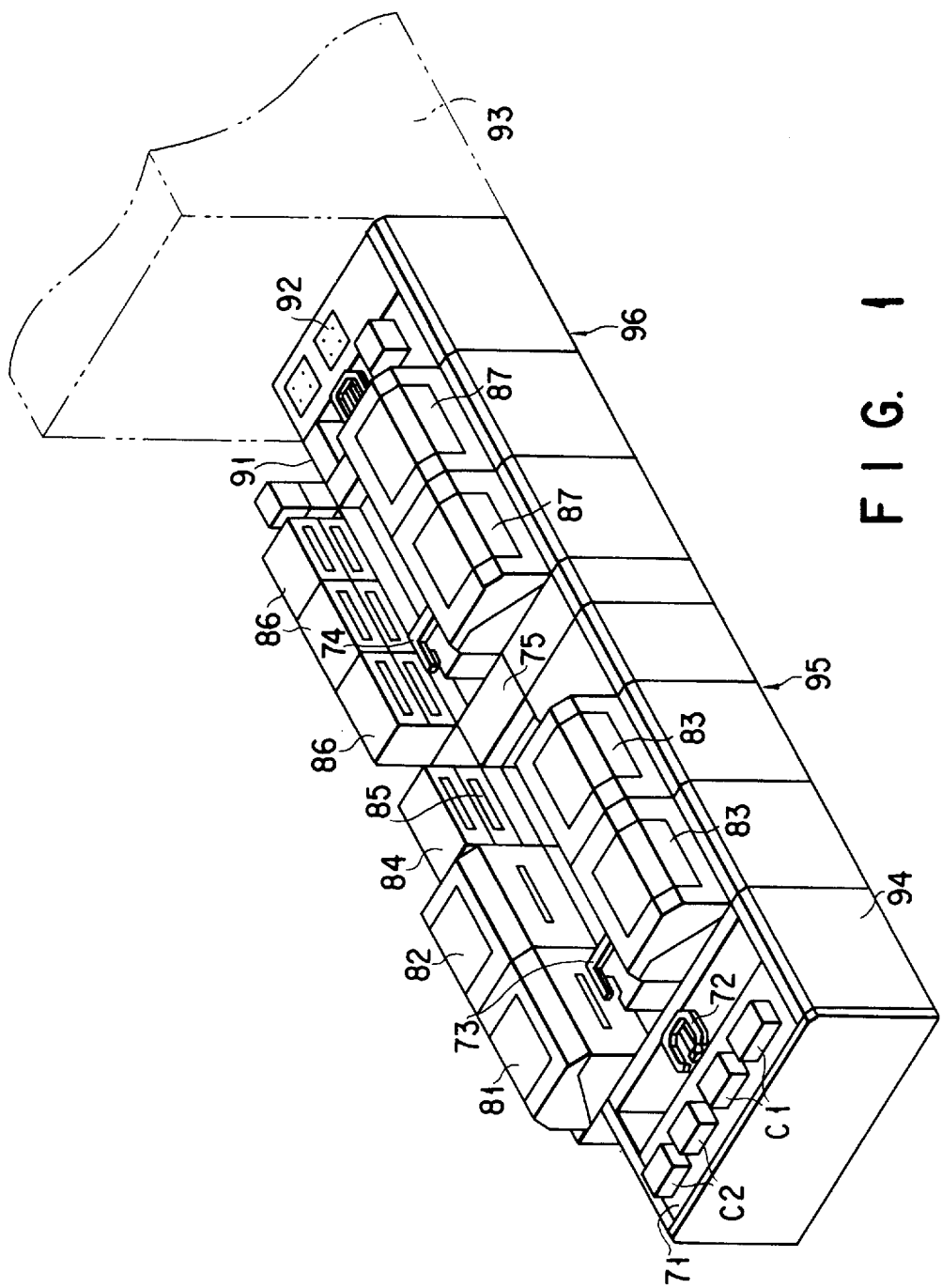
FIG. 1 schematically shows the construction of a coating-developing apparatus used for working a method for developing treatment according to an embodiment of the present invention.

The method of the present invention for developing treatment is featured in that pure water is supplied first onto a surface of an object to be treated to form a pure water film on the surface of the treating object, followed by supplying a treatment solution onto the surface of the treating object having the pure water film formed in the preceding step. Since a pure water film is formed before supply of a developing solution, the adverse effect given to the resist film at the start-up time of supplying the treatment solution, i.e., the first impact, can be alleviated in the method of the present invention. It follows that the method of the present invention permits suppressing the defective development caused by the first impact.

The problems of first impact take place in various cases. In, for example, a paddle type developing solution supply apparatus, a compressed gas such as a compressed nitrogen gas is blown into a treatment solution, e.g., a developing solution housed in a tank so as to pressurize the developing solution. The pressurized developing solution is supplied to a developing solution supply nozzle and, then, spurted to the outside through apertures formed in the nozzle. The developing solution spurted from the apertures of the nozzle collide against local regions alone right under the nozzle apertures on the surface of the resist film. As a result, development proceeds excessively in the local regions alone, giving rise to an uneven development of the resist film.

It should also be noted that the developing solution is pressurized from the atmospheric pressure to a predetermined higher pressure, preferably 0.5 to 7 $kg/cm^2$ e.g., 3 $kg/cm^2$, and, then, spurted outside from the nozzle apertures so as to collide against the resist film. The developing solution colliding against the resist film is bubbled by the impact of the collision and by the release from the high pressure. The bubble thus generated degradation of resolution.

The defects derived from the first impact, which are generated in the paddle type developing solution supply apparatus as described above, are also generated in a so-called "stream nozzle" or in a so-called "multi-nozzle type".

The first impact is increased with increase in the distance between an object to be treated, e.g., a resist film, and the nozzle. Therefore, in performing a developing treatment, it is desirable to bring a nozzle for supplying a treatment solution and pure water to a position in the vicinity of (right above) a surface of an object to be treated so as to supply pure water from the nozzle to the surface of the treating object in a manner to form a pure water curtain extending from the nozzle to reach the surface of the treating object.

It is desirable to add a surface active agent to the treatment solution because wetness (affinity) of the treatment solution against the resist film.

In the method of the present invention, the pure water supply is stopped after formation of the pure water film on the surface of the treating object, followed by supplying a treatment solution. Alternatively, the developing solution may be supplied during the pure water supply. It is also possible for the pure water supply to be stopped during supply of the treatment solution. After the treatment with the treatment solution, a washing step such as a rinsing treatment is performed. In this step, a rinsing solution may be supplied after or during supply of the treatment solution. Alternatively, supply of the treatment solution may be stopped during supply of the rinsing solution.

FIG. 1 schematically shows a coating-developing apparatus used for working the method of the present invention for developing treatment. As shown in the drawing, the apparatus consists mainly of a load-unload section 94, a first treating section 95, a second treating section 96, and a light-exposure device 93. A carrier stage 71 is included in the load-unload section 94. A carrier C1 housing a plurality of objects to be treated, i.e., substrates before treatment, and a carrier C2 housing substrates after treatment, are arranged on the carrier stage 71. The load-unload section 94 is provided with a pair of pincers 72 for transferring the substrate into and out of the section 94 through open portions of the carriers C1 and C2. Main arms 73, 74 for transferring the substrates are arranged in the central portions of the first and second treating sections 95, 96, respectively. Further, a receiving platform 75 is arranged between the first treating section 95 and the second treating section 96.

Arranged along the passageway of the main arm 73 are a brush washing device 81, a jet water washing section 82, a coating device 83, an adhesion treating section 84 and a cooling section 85. On the other hand, arranged along the passageway of the main arm 74 are a heating section 86 and a developing section 87. Further, a pair of pincers 91 and a receiving platform 92 are arranged between the second treating section 96 and the light-exposure device 93.

The coating-developing apparatus of the construction described above, the untreated substrate housed in the cassette C1 is taken out by the pincers 72 and, then, transferred onto the main arm 73. Further, the untreated substrate is transferred by the main arm 73 into the brush washing section 81. After brush-washing within the section 81, the substrate is washed with a high pressure jet water, as required, within the jet water washing section 82. After the washing treatment, the substrate is subjected to a hydrophobic treatment to make the substrate hydrophobic within the adhesion treating section 84 and, then, cooled in the cooling section 85. Further, the substrate is coated with a photoresist film, i.e., a photosensitive film, within the coating device 83. After the coating step, the photoresist film is selectively exposed in a predetermined pattern to light within the light-exposure device 93. Further, the substrate after the light-exposure step is transferred into the developing section 87. Within the developing section 87, the light-exposed pattern is developed with a developing solution deaerated by a deaeration mechanism and, then, the residual developing solution is washed away with a rinsing solution so as to finish the developing treatment.

FIG. 2 schematically shows a developing apparatus used in a developing method according to one embodiment of the present invention. As shown in the drawing, the developing apparatus comprises a tank 1 housing a developing solution 2. A gas bomb 3 storing a compressed gas such as a compressed nitrogen gas is connected via a pipe 4 to the tank 1. One end portion of a pipe 5 is dipped in the developing solution 2 housed in the tank 1. An intermediate tank 6 and a deaeration mechanism 7 for a treating solution are mounted to the pipe 5. The compressed gas, e.g., compressed nitrogen gas, is supplied from the gas bomb 3 into the developing solution 2 housed in the tank 1 so as to permit the developing solution 2 to be pressurized. The pressurized solution is supplied through the pipe 5 toward a nozzle 12.

The pipe 5 is branched downstream of the deaeration mechanism 7 into branched pipes 5a and 5b such that these branched pipes 5a, 5b are connected to the nozzle 12. Mounted to the branched pipe 5a between the branching point and the nozzle 12 are a flow meter 8a, a filter 9a, a water jacket 10a, and an air operation valve 11a. Likewise, mounted to the branched pipe 5b between the branching point and the nozzle 12 are a flow meter 8b, a filter 9b, a water jacket 10b, and an air operation valve 11b. The developing solution is supplied through these branched pipes 5a and 5b into the nozzle 12.

On the other hand, the developing section 13 is equipped with a chuck 14 for holding a substrate, e.g., a semiconductor wafer W, by means of vacuum suction, a motor 15 for rotating the chuck 14, and a cup 16 surrounding the semiconductor wafer W held by the chuck 14.

Mounted outside the intermediate tank 6 are a limit sensor 6a and an empty sensor 6b each consisting of, for example, an electrostatic capacity sensor. The signals generated from these sensors 6a, 6b are supplied to a controller (not shown) so as to control the surface level of the developing solution 2 within the tank 1. The flow rates of the developing solution 2 flowing through the branched pipes 5a, 5b are controlled by the flow meters 8a, 8b, respectively. Then, impurities or the like contained in the developing solution 2 are removed by the filters 9a, 9b. It should be noted that water of a controlled temperature is circulated through the water jackets 10a, 10b so as to control the temperature of the developing solution 2 flowing through the branched pipes 5a, 5b. Then, the developing solution 2 is supplied from the nozzle 12 onto the semiconductor wafer W held by the chuck 14 for the developing treatment.

A rinse nozzle 17 is movably arranged outside the cup 16. Further, in the cup 16, a back rinse dispenser 18 is arranged, which dispense the rinsing solution toward to the rear surface of the wafer W.

Figure 4:
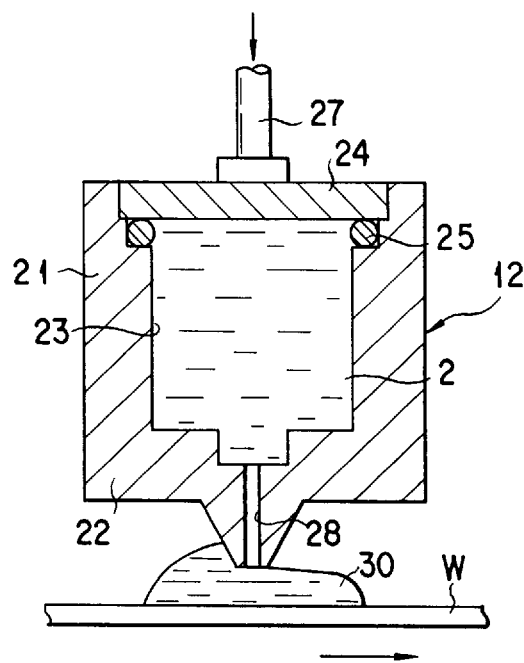
FIG. 4 is a cross sectional view along line IV—IV shown in FIG. 3.
Figure 5:
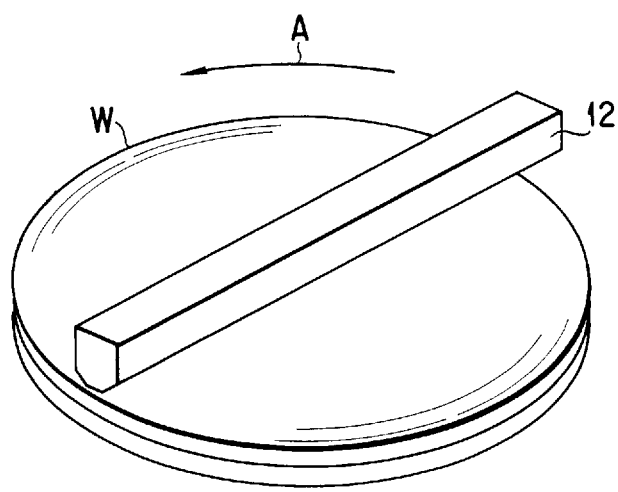
FIG. 5 shows how the nozzle shown in FIG. 3 is operated for supplying a developing solution.

The nozzle 12 is shown in a magnified fashion in FIG. 3 and FIG. 4, which is a cross sectional view along line IV—IV shown in FIG. 3. As seen from these drawings, the nozzle 12 includes a developing solution-housing chamber 23 defined by a side wall 21 and a bottom wall 22. An upper opening of the chamber 23 is closed by a lid member 24, and the clearance between the lid member 24 and the side wall 21 is sealed by a packing 25. The lid member 24 is provided with two inlet ports 27. The developing solution 2 flowing through the branched pipes 5a, 5b is supplied through these inlet ports 27 into the developing solution-housing chamber 23. A plurality of discharge ports 28 are formed through the bottom wall 22 such that these discharge ports 28 are arranged in a longitudinal direction of the bottom wall 22. The developing solution 2 housed in the chamber 23 is supplied through these discharge ports 28 onto the semiconductor wafer W. The length in a horizontal direction of the nozzle 12 is substantially equal to the diameter of the semiconductor wafer W.

Figure 6:
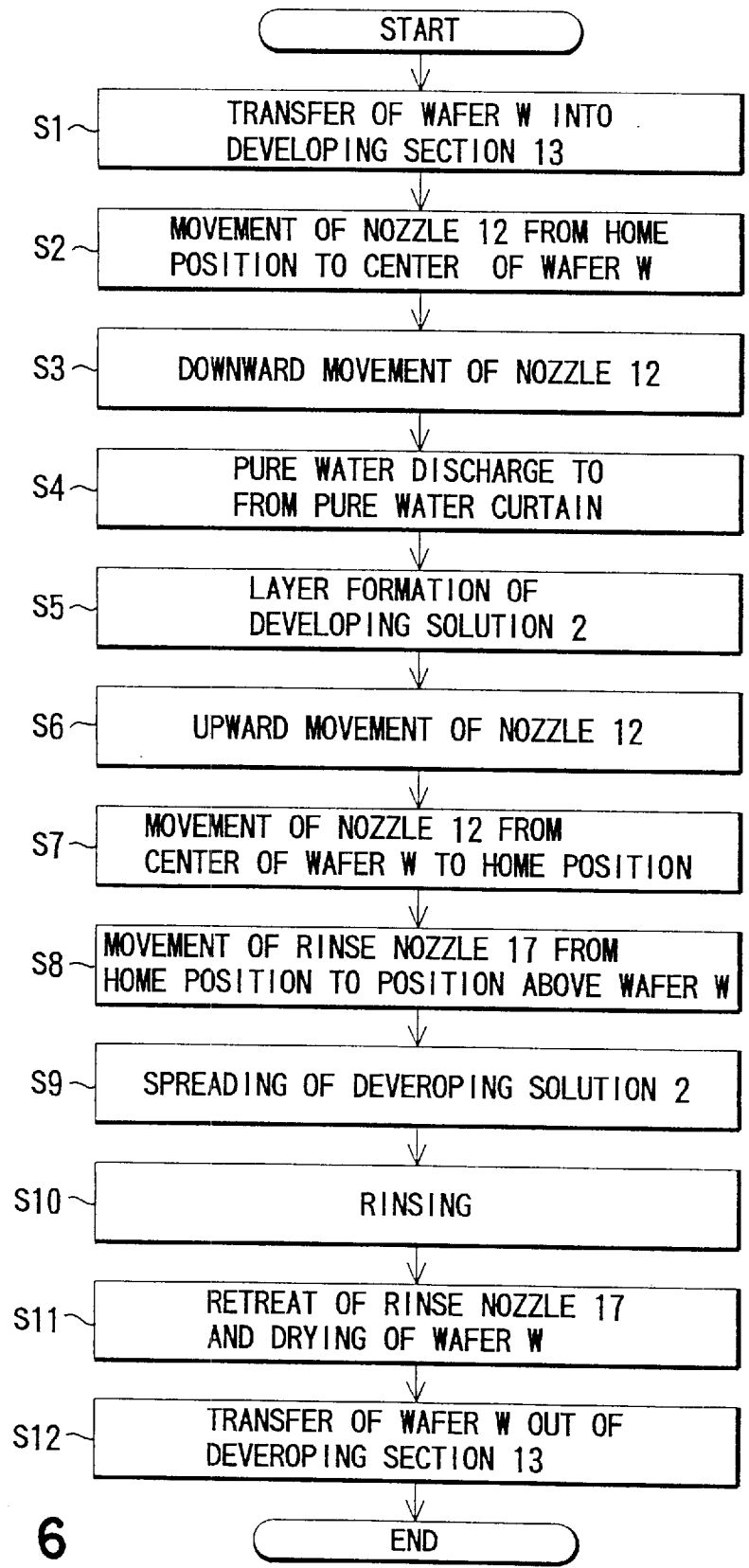
FIG. 6 is a chart showing how a method of the present invention for developing treatment is worked.

In the developing treatment apparatus having the above-described structure, the resist film is developed according to the flow chart as shown in FIG. 6, for example.

(1) Load the semiconductor wafer W having the resist film formed on its surface, into the developing section 13 (step S1 in FIG. 6). In this case, the semiconductor wafer W is supported by the main arm 73 for transferring the wafer show in FIG. 1, put into the developing section 13 and is mounted on the chuck 14 shown in FIG. 2. Next, the chuck 14 operates to hold the semiconductor wafer W by absorbing it.

(2) Move the nozzle 12 upward at its home position. Then, move the nozzle 12 from the home position to the wafer center position (S2 in FIG. 6). Then, move the nozzle 12 downward. To be more specific, move the nozzle 12 to a position of the height of, for example, 1.0 to 1.2 mm, above the center of the wafer W, as shown in FIG. 4 (step S3 in FIG. 6).

(3) After the nozzle 12 has been stopped, discharge the pure water onto the wafer W for 0.3 to 0.5 seconds from the discharge ports 28 in the state that the nozzle 12 is stationary (step S4 in FIG. 6). As a result, the clearance between the resist film 31 formed on the surface of the wafer W and the nozzle 12 is connected continuously in the longitudinal direction by the pure water 30, so that a curtain of the pure water 30 is formed.

(4) Then, discharge the developing solution 2 onto the wafer W for 0.3 to 0.5 seconds from the discharge ports of the nozzle 12, while driving the motor 15 to rotate the wafer W by a half turn in the arrow direction A, for example. As a result, the developing solution is formed in a layer on the surface of the resist film 31 formed on the wafer W (step S5 in FIG. 6). In this case, the wafer W is rotated at a low speed of, for example, approx. 30 rpm.

(5) Stop the rotation of the wafer W after forming the layer of the solution. At the same time, move the nozzle 12 upward at the wafer center position (step S6 in FIG. 6) and bring the nozzle 12 back to its home position (step S7 in FIG. 6).

(6) Move the rinse nozzle 17 upward and move it from its home position to a predetermined position on the wafer W so that the front end portion of the rinse nozzle 17 is positioned above the wafer W (step S8 in FIG. 6). Then, move the rinse nozzle 17 downward.

(7) After a lapse of predetermined period of developing treatment processing time since the formation of the developing solution, rotate the wafer W to centrifugally remove the residual developing solution 2 from the wafer W (step S9 in FIG. 6). Then, drip the rinsing solution from the rinsing nozzle 17 onto the front surface of the wafer W, and at the same time, disperse the rinsing solution toward the rear surface of the wafer W from the back rinse disperser 18, to thereby rinse the front surface and rear surface of the wafer W (step 10 in FIG. 6). Stop the supply of the rinsing liquid by the rinse nozzle 17 and the back rinse disperser 18 while the wafer W is rotating.

(8) After completion of the rinsing treatment, move the rinse nozzle 17 upward and bring it back to its home position. In this case, the wafer W continues to be rotated, with the result that the wafer W is dried (step S11 in FIG. 6).

(9) After a predetermined period of the drying operation, stop the rotation of the wafer W to stop the drying of the wafer w.

(10) The main arm 73 receives the wafer W from the chuck 14 and takes the wafer W out from the developing section 13 (step S12 in FIG. 6).

In the resist developing method described above, a curtain of pure water 30 is formed in step (4) to fill the clearance between the nozzle 12 and the resist film 31. In the subsequent step (5), the pure water 30 is spread in accordance with rotation of the wafer W, with the result that a film of the pure water 30 is formed to cover the surface of the resist film 31 formed on the wafer W. Then, when the developing solution 2 is discharged from the nozzle 12, the discharged developing solution 2 is gradually mixed with the pure water 30 so as to permit the developing solution 2 to be supplied uniformly over the entire surface of the resist film 31. What should be noted is that the presence of the film of the pure water 30 permits moderating the first impact which takes place when the developing solution 2 is brought first into contact with the wafer W. It is also possible to prevent an excessive development and bubble involvement which are caused by an excessive developing time in the case where the developing solution 2 alone is used for the film formation as in the conventional method. In short, the method of the present invention makes it possible to prevent excessive development caused by the first impact at the positions right under the discharge ports 28 of the nozzle 12 and by an excessive developing time. It is also possible to prevent bubbles from being involved in the developing solution 2. Further, the method of the present invention permits uniformly supplying the developing solution onto the resist film, making it possible to prevent a defective development.

In forming a layer of the developing solution 2 in step (5) (S5 shown in FIG. 6), it is possible to supply the developing solution 2 without rotating the wafer W. In this case, the wafer W is rotated while supplying the developing solution 2 from the nozzle 12 after formation of a curtain of the developing solution between the nozzle 12 and the resist layer 31. It should be noted in this connection that a curtain of the pure water 30 is formed in advance to fill the clearance between the nozzle 12 and the resist film 31. As already pointed out, the presence of the pure water curtain permits moderating the first impact taking place when the developing solution 2 is brought first into contact with the resist film 31. It is also possible to prevent an excessive development and bubble involvement caused by an excessive developing time in the conventional method in which the developing solution 2 alone is used for forming a liquid film. It follows that the method of the present invention makes it possible to prevent excessive development caused by the first impact at the positions right under the discharge ports 28 of the nozzle 12 and by an excessive developing time. It is also possible to prevent bubbles from being involved in the developing solution 2. Further, the method of the present invention permits uniformly supplying the developing solution onto the resist film, making it possible to prevent a defective development.

As described above, defects of a semiconductor wafer W derived from the first impact of a treatment solution are prevented or suppressed in the developing method of the present invention by allowing a pure water curtain to be interposed between the object to be developed, e.g., a resist film, and the nozzle for supplying a treatment solution, e,g., a developing solution to the resist film in the step of bringing first the developing solution into contact with the resist film.

In the resist developing method of the present invention described above, the pure water 30 is not supplied from the nozzle 12 after formation of the pure water curtain to fill the clearance between the nozzle 12 and the resist film 31 in step (4) as shown in FIG. 7. However, it is possible to supply the developing solution 2 in step (5) file supplying the pure water 30 onto the surface of the resist film 31. In this case, the pure water supply may be stopped during supply of the developing solution 2.

Figure 8:
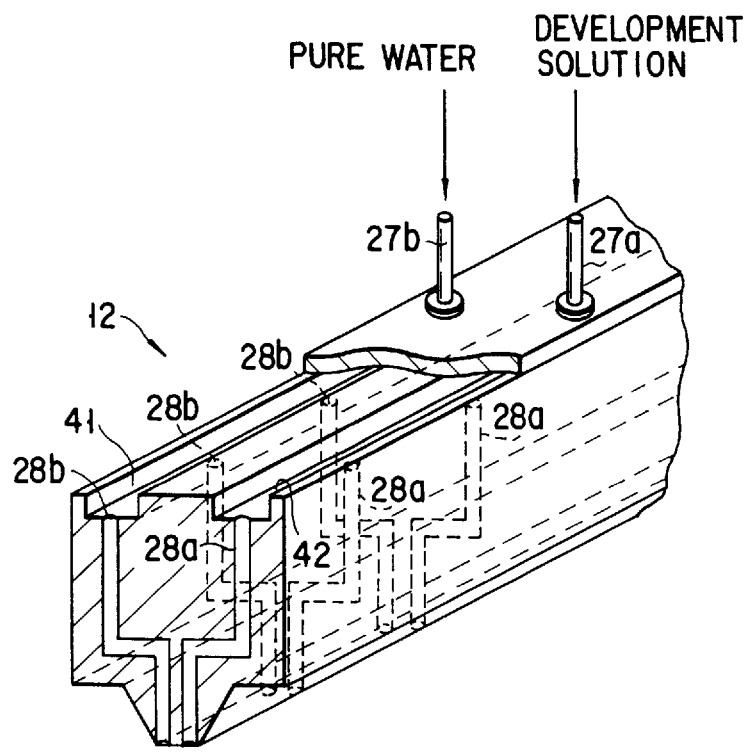
FIG. 8 is an oblique view, partly broken away, showing the supply systems of pure water and developing solution in respect of the nozzle shown in FIG. 3.

FIG. 8 shows a nozzle 12' used for selectively supplying the pure water 30 and the developing solution 2 as described above. As shown in the drawing, the nozzle 12' comprises a developing solution supply pipe 27a and a pure water supply pipe 27b. The switching between the developing solution supply and the pure water supply is performed by selectively opening-closing the valves for the developing solution supply pipe 27a and pure water supply pipe 27b. A pair of grooves 41, 42 are formed in the nozzle 12' in a manner to extend substantially parallel with each other in the longitudinal direction of the nozzle 12'. The groove 41 communicates with the developing solution supply pipe 27a, with the other groove 42 communicating with the pure water supply pipe 27b. Further, the nozzle 12' is provided with a plurality of liquid discharge holes 28a and a plurality of liquid discharge holes 28b. These liquid discharge holes 28a, 28b are arranged substantially equidistantly in the longitudinal direction of the nozzle 12' such that a plurality of pairs are formed by these liquid discharge holes 28a and 28b. In each of these pairs, the liquid discharge hole 28a communicates with groove 41, with the liquid discharge hole 28b communicating with the groove 42. It follows that the developing solution 2 is discharged onto the resist film 31 through the developing solution discharge pipe 27a, the groove 41 and the liquid discharge hole 28a. Likewise, the pure water 30 is discharged onto the resist film 31 through the pure water supply pipe 27b, the groove 42 ad the liquid discharge hole 28b.

Figure 9:
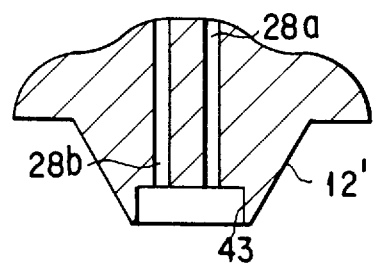
FIG. 9 is a cross sectional view showing a gist portion of a modification of the nozzle shown in FIG. 8.

It is desirable to form a recess 43 in the tip portion of the nozzle 12', as shown in FIG. 9, such that the tip portions of the liquid discharge holes 28a, 28b are open in the recess 43.

Figure 10:
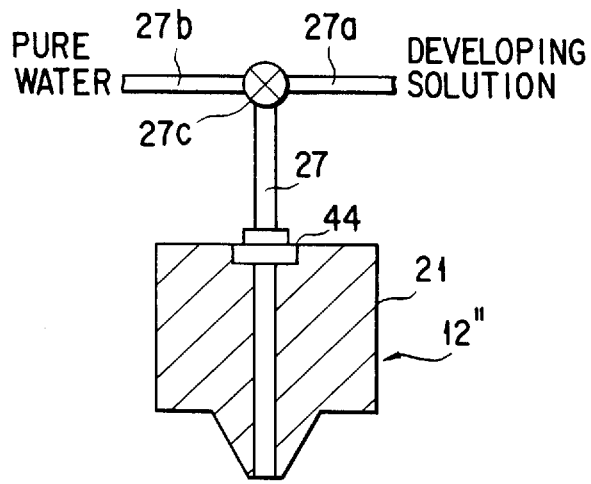
FIG. 10 schematically shows the supply systems of pure water and developing solution in respect of the nozzle shown in FIG. 3.
Figure 11:
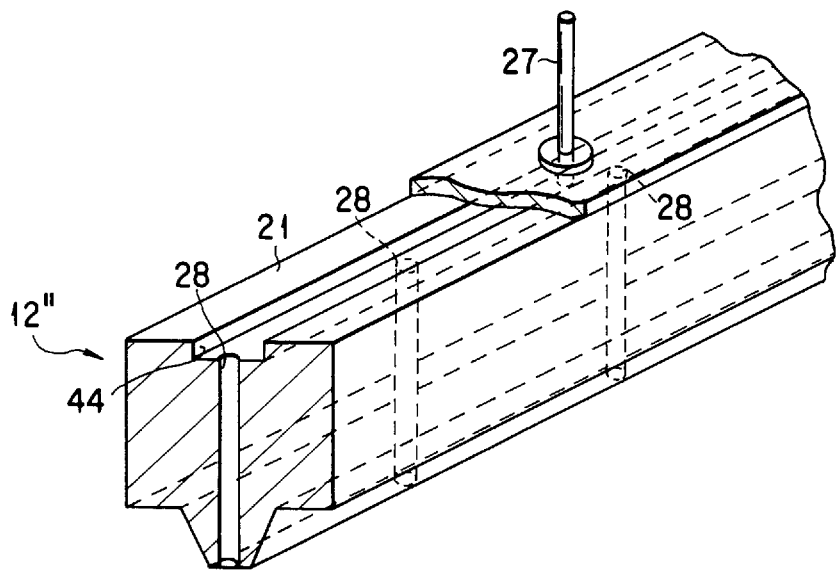
FIG. 11 is an oblique view, partly broken away, showing the nozzle shown in FIG. 10.

FIGS. 10 and 11 collectively show a nozzle 12". As shown in the drawings, the nozzle 12" is constructed such that the developing solution supply pipe 27 is connected via a switching valve 27c to each of the developing solution supply pipe 27a and the pure water supply pipe 27b. In this case, the switching between the developing solution supply and the pure water supply is performed by selectively opening-closing the switching valve 27c. FIG. 11 shows that a single groove 44, which communicates with the main pipe 27, is formed in a central portion of the nozzle 12" in a manner to extend in the longitudinal direction of the nozzle 12". A plurality of liquid discharge holes 28 are arranged substantially equidistantly in the longitudinal direction of the nozzle 12". It follows that the developing solution 2 is discharged onto the surface of the resist film 31 through the developing solution pipe 27a, the main pipe 27, the groove 44 and the liquid discharge hole 28. Likewise, the pure water 30 is discharged onto the surface of the resist film 31 through the pure water pipe 27b, the main pipe 27, the groove 44 and the liquid discharge hole 28.

Incidentally, the control for opening-closing the valve 27c is performed by a control device (not shown) in accordance with the horizontal and vertical movements of the nozzle 12' or 12" and with rotation of the wafer W.

A developing treatment was applied to an 8-inch wafer coated with a resist of a high resolution by the developing method of the present invention and by the conventional developing method, with the result that the method of the present invention has been found to permit improvement by 90% or more, compared with the conventional method. This clearly supports a prominent effect produced by the method of the present invention.

Figure 12:
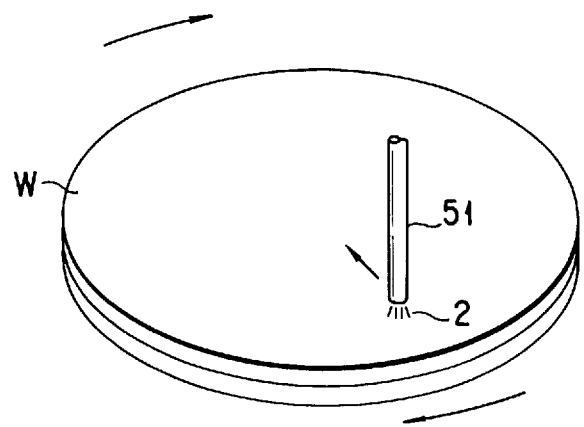
FIG. 12 shows another modification of the nozzle used in the method of the present invention for developing treatment.
Figure 13:
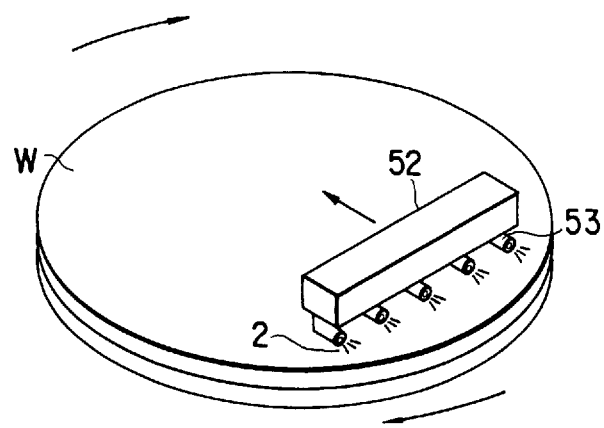
FIG. 13 shows still another modification of the nozzle used in the method of the present invention for developing treatment.

Nozzles of constructions other than those described above can also be used in the present invention. For example, it is possible to use a stream nozzle 51 shown in FIG. 12 or a multi-nozzle type device prepared by connecting a plurality of nozzles 53 to a nozzle body 52, as shown in FIG. 13. In each of these modifications, the nozzle is moved linearly in a horizontal direction while rotating the semiconductor wafer W, i.e., the object to be treated.

In the first embodiment as described above, a pure water is supplied before supply of a developing solution so as to form a liquid film and/or a curtain of the pure water 30. However, it is also possible to use a solvent capable of dissolving the developing solution, e.g., polyvinyl alcohol (PVA), or the like in place of the pure water.

Figure 14:
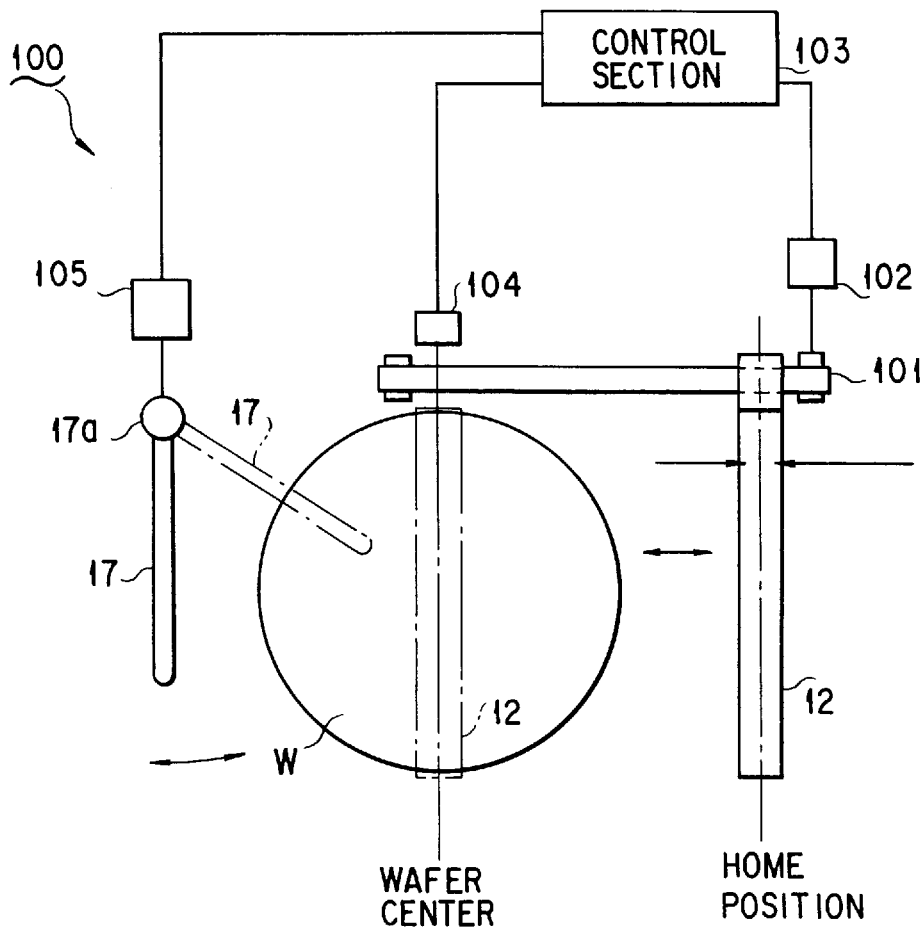
FIG. 14 is a top plan view showing the developing section used in the second embodiment of the method for developing treatment according to the present invention.

A second embodiment of the method for resist developing treatment according to the present invention will be explained next. FIG. 14 shows a developing section 100 to be used for the method for resist developing treatment relating to the second embodiment of the present invention.

In FIG. 14, items of the same structures as those in the first embodiment will be attached with the same reference numbers and their explanation will be omitted.

The developing section 100 shown in FIG. 14 includes a nozzle 12 having two supply systems of a pure water and a developing liquid, a conveyer belt 101 for moving the nozzle 12 between a home position and a wafer center position and motor 102 for driving the conveyer belt 101. The motor 102 is connected to a control section 103 and is operated or stopped according to a control signal from the control section 103.

The wafer center position is provided with a sensor 104 for detecting that the nozzle 12 has reached the wafer center position. The sensor, 104 is electrically connected to the control section 103 so that the detection signal from the sensor 104 is transmitted to the control section.

On the other hand, the developing section 100 has rinse nozzle 17 for rinsing the front surface of the wafer W, and a motor 105 is connected to a rotation axis 17a of the rinse nozzle 17. The motor 105 is also electrically connected to the control section 103 and is operated or stopped according to a control signal from the control section 103.

Figure 15:
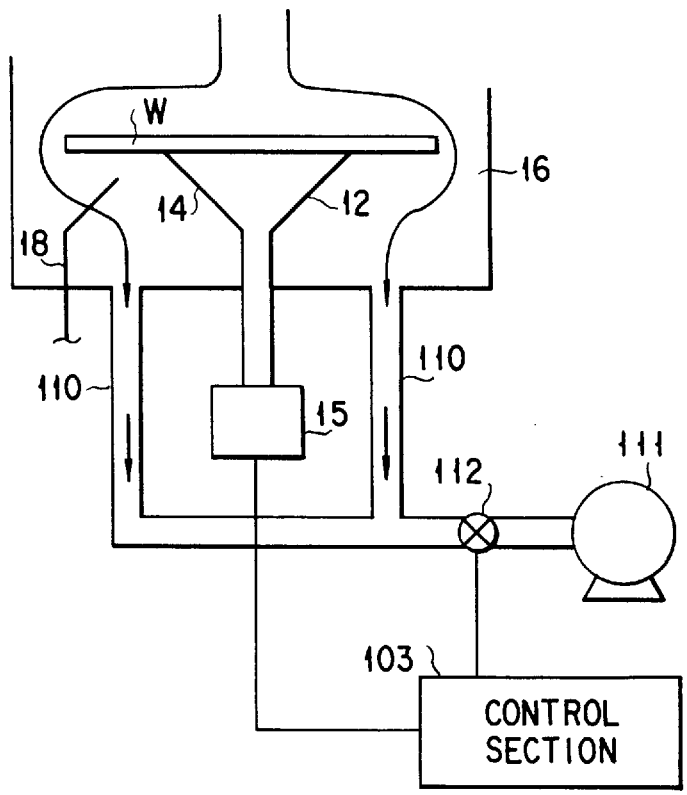
FIG. 15 is a schematic vertical longitudinal sectional view showing the gist portion of the developing section shown in FIG. 14.
Figure 16:
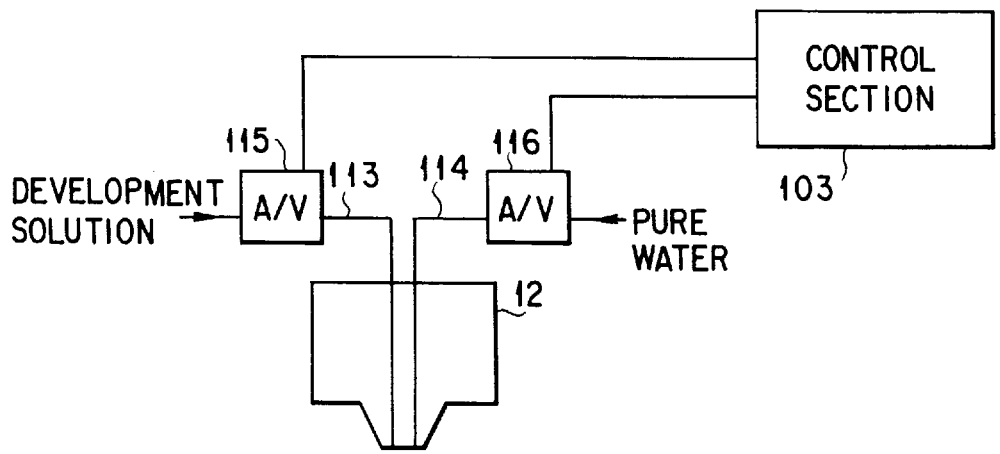
FIG. 16 is a schematic vertical longitudinal sectional view showing the gist portion of the developing section shown in FIG. 14.

Further, as shown in FIG. 15, a motor 15 for rotating a chuck 14 is electrically connected to the control section 103 so that the motor 15 is operated or stopped and its rotation number and acceleration are also controlled according to a control signal from the control section 103.

Further, as shown in FIG. 15, a plurality of exhaust pipes 110 are connected to the bottom section of a cup 16 which encircles the chuck 14 for holding the wafer W, and an air is exhausted from the cup 16 by an exhaust pump 111. In other words, a gas around the wafer W is absorbed and removed through the exhaust pipe 110. The exhaust pipe 110 is provided with an auto damper.

The auto damper 112 is electrically connected to the control section 103 and is opened or closed according to a control signal from the control section 103.

The nozzle 12 is provided with supply pipes 113 and 114 for supplying a pure water and a developing solution to the nozzle 12 respectively, and the supply pipes 113 and 114 are provided with air bulbs 115 and 116 respectively. These air bulbs 115 and 116 are electrically connected to the control section 103 so as to be opened or closed according to a control signal from the control section 103.

The control sequence of the resist developing treatment process in the above-described developing section 100 will be explained below.

Table 1 below shows one example of the control sequence of the resist treatment process.

TABLE 1

| Step | Time (second) | Rotation number (rpm/sec) | Acceleration speed (rpm/sec) | Registered operation | Speed | Nozzle 12 Position | Nozzle 12 Mode | Rinse nozzle 17 |
|---|---|---|---|---|---|---|---|---|
| 1 | 1.0 | 0 | 10000 | 0 | 1 | CENTER | WAIT | HOME |
| 2 | 0.3 | 0 | 10000 | 1 | 1 | CENTER | NON-WAIT | HOME |
| 3 | 1.0 | 30 | 10000 | 2 | 1 | CENTER | NON-WAIT | HOME |
| 4 | x | 0 | 10000 | 3 | 1 | HOME | NON-WAIT | HOME |
| 5 | 5.0 | 0 | 10000 | 0 | 1 | HOME | NON-WAIT | IN |
| 6 | 5.0 | 2000 | 5000 | 4, 5 | 1 | HOME | NON-WAIT | IN |
| 7 | 10.0 | 500 | 10000 | 4, 5 | 1 | HOME | NON-WAIT | IN |
| 8 | 1.0 | 500 | 10000 | 0 | 1 | HOME | NON-WAIT | HOME |
| 9 | 15.0 | 4000 | 10000 | 0 | 1 | HOME | NON-WAIT | HOME |
| 10 | 1.0 | 0 | 5000 | 0 | 1 | HOME | NON-WAIT | HOME |

TABLE 1-continued

| Step | Time (second) | Rotation number (rpm/sec) | Acceleration speed (rpm/sec) | Registered operation | Nozzle 12 | | | Rinse nozzle 17 |
|---|---|---|---|---|---|---|---|---|
| | | | | | Speed | Position | Mode | |

Registered Operation
1: formation of a pure water curtain,
2: discharging of a developing solution,
3: closing the auto damper,
4: rinse,
5: rinsing the rear surface,
0: No operation In the above sequence, at step 1, the control section 103 drives the motor 102 for 1.0 second to move the nozzle 12 from its home position to the wafer center position. In this case, the initial value of the rotation acceleration speed of the wafer W is set at 10000 rpm/sec. The rinse nozzle 17 is located at its home position.

In this step 1, the control mode of the nozzle 12 is in WAIT mode. The WAIT mode refers to the state in which the nozzle 12 is waiting for the completion of other operation, such as, for example, the completion of a placing operation of the wafer W. Accordingly, the operation of the nozzle 12 in the WAIT mode is controlled with a position priority.

As an initialization, the control section 103 drives the exhaust pump 111 to exhaust the air within the cup 16 through the exhaust pipe 110 and remove a mist generated within the cup 16.

Next, at step 2, the mode of the nozzle 12 is changed from the WAIT state to NON-WAIT state. The NON-WAIT state is a state in which the nozzle 12 operates according to a lapse time without waiting for other operation. Accordingly, the nozzle 12 is controlled with a time priority.

The change-over of the mode is carried out as follows. For example, when the nozzle 12 has reached the wafer center position, the sensor 104 detects this, and transmits a signal to the control section 103. Based on this signal, the control section 103 changes the operation mode of the nozzle 12 from the WAIT to the NON-WAIT mode.

At step 2, the air bulb 116 is opened in the state that the rotation number of the wafer W is 0, that is, the wafer W is stopped, and the pure water is supplied for 0.3 second from the nozzle 12. With this arrangement, a curtain of a pure water is formed between the nozzle 12 and the surface of the wafer W, in the same manner as that in the first embodiment.

At step 3, the air bulb 115 is opened while rotating the wafer W at the rotation number of 30 rpm for one second with the acceleration speed of 10000 rpm/sec so that the developing solution is discharged from the nozzle 12. As a result, a layer of the developing solution is formed on the surface of the wafer W.

At step 4, the rotation of the wafer W is stopped for a predetermined period of time x, and the developing treatment is progressed. During this period, the control section 103 closes the auto damper 112 and stops the exhaust from the cup 16. After a lapse of the time x during which period the exhaust from the cup 16 has been stopped, the control section 103 opens the auto damper 112 again to start the exhausting.

At step 5, the control section 103 drives the motor 105 so as to move the rinse nozzle 17 from its home position to a predetermined position above the wafer W.

At step 6, the control section 103 drives the motor 15 to rotate the wafer W at the rotation number of 2000 rpm for five seconds with the acceleration speed of 5000 rpm/sec. At the same time, the control section 103 makes the rinse solution to be dripped onto the front surface of the wafer W from the rinse nozzle 17 and disperses the rinse solution toward the rear surface of the wafer W by the back rinse disperser 18.

At step 7, the control section 103 drives the motor 15 to rotate the wafer W at the rotation number of 500 rpm for five seconds with the acceleration speed of 10000 rpm/sec. At the same time, the control section 103 makes the rinse solution to be dripped onto the surface of the wafer W from the rinse nozzle 17 and disperses the rinse solution toward the rear surface of the wafer W by the back rinse disperser 18.

At step 8, the control section 103 drives the motor 15 to rotate the wafer W at the rotation number of 500 rpm with the acceleration speed of 10000 rpm/sec. At the same time, the ring nozzle 17 is moved from above the wafer W and is returned to its home position.

At step 9, the control section 103 drives the motor 15 to rotate the wafer W at the rotation number of 4000 rpm for ten seconds with the acceleration speed of 10000 rpm/sec. By the rotation of the wafer W at steps 8 and 9, the wafer W is dried out.

At step 10, the control section drives the motor 102 to move the nozzle 12 from the wafer center position to the home position of the nozzle 12.

In the resist method for developing treatment which is carried out according to the above-described control sequence, the mode of the nozzle 12 is changed from the WAIT to the NON-WAIT mode at step 1 and step 2 afterwards. The change of the mode of the nozzle 12 has the following advantages. At the step 1 and before, it is desirable that the nozzle 12 is waiting for the completion of other operation, such as, for example, the completion of the mounting of the wafer W on the chuck 14, from the viewpoint of prevention of an idle operation.

However, the step 2 afterward include the processes of determining a developing treatment time such as the discharging of the developing solution to form a layer of the developing solution, the starting of rinsing, etc. Accordingly, it becomes possible to carry out the resist developing accurately in a predetermined developing treatment time by controlling the operation of the nozzle 12 according to the lapse time without waiting for the completion of other operation. As a result, it becomes possible to increase the accuracy of the resist developing treatment and uniformity between the wafers W.

Further, according to the above-described method for resist developing treatment, the exhaust from the cup 16 is stopped at step 4. An exhaust from the cup 16 generates an air flow within the cup 16 as shown by arrows in FIG. 15. This air flow generates a difference between the temperature at the outer periphery section of the wafer W and the temperature at the center section of the wafer W. When there arises a difference of temperature within the plane of the wafer W, a variance occurs in the resist developing treatment. When the exhaust is stopped, the occurrence of a difference in the temperatures can be prevented so that a uniform resist treatment within the plane can be improved.

Further, according to the method for resist developing treatment relating to the above-described second embodiment, the rotation acceleration speed of the wafer W at step 6 is made lower than the rotation acceleration speed of the wafer W at steps 8 and 9. At step 6, the wafer W is rotated to remove centrifugally the developing solution remaining on the surface of the wafer W and the rinsing solution is supplied to the surface of the wafer W from the rinse nozzle 17 to rinse the surface of the wafer W. However, the developing solution has still a high density at the time immediately after the starting of the dripping of the rinsing solution from the rinse nozzle 17 by the rotation of the wafer W. When such a high-density developing solution is dispersed in a mist, the mist is adhered to the surface of the wafer W after the rising, which easily becomes a cause of a generation of a variation of developing.

On the other hand, at steps 8 and 9, the wafer W is rotated to centrifugally dry out the wafer W. In this case, since most of the developing solution has been replaced with the rinsing solution by the rinsing at steps 6 and 7, there is little risk of a dispersing of the developing solution.

Thus, in the process of removing the developing solution at step 6, the acceleration speed of the wafer W is made lower than that at the time of drying the wafer W at steps 8 and 9 so that the dispersion of the developing solution can be prevented.

Although a semiconductor has been used as an object to be treated in the above-described first and second embodiments, the object is not limited to this but may be a liquid crystal display substrate or the like, for example. It is also possible to modify the present invention within the scope of the gist of the present invention.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

I claim:

1. A method for developing treatment in which a developing solution is supplied to an object to be treated for performing a developing treatment, using developing treatment apparatus comprising a nozzle for supplying said treatment solution and a pure water to said object to be treated, nozzle moving means for moving said nozzle between a first position as a starting point and a second position for supplying said treatment solution and said pure water to said object to be treated, treatment solution supply means for supplying said treatment solution to said nozzle, pure water supply means for supplying said pure water to said nozzle and control means for controlling the operation of said nozzle moving means, said treatment solution supply means and said pure water supply means, comprising the steps of:

said control means making said nozzle moving means move said nozzle from a first position to a second position in WAIT mode;

said control means changing a control mode of said nozzle from a WAIT mode to a NON-WAIT mode;

said control means making said pure water supply means supply said pure water to said nozzle to supply pure water from said nozzle onto the surface of said object to be treated so as to form a liquid film of a pure water on the surface of said object to be treated; and said control means making said treatment solution supply means supply said treatment solution to said nozzle to supply said treatment solution from said nozzle.

2. The method according to claim 1, wherein said developing treatment apparatus further comprises rotating means for rotating an object to be treated and said control means further comprises a step for making said rotating means to rotate said object to be treated which has said liquid film of said pure water formed thereon.

3. The method according to claim 1, wherein said developing treatment apparatus further comprises rotating means for rotating an object to be treated and rinsing solution supply means for supplying a rinsing solution onto the surface of said object to be treated and said method for developing treatment further comprises a step that said control means makes said rotating means rotate said object to be treated while making said rinsing solution supply means supply said rinsing solution to said object to be treated to which said treatment solution has been supplied, to thereby centrifugally remove said treatment solution from said object to be treated, and then makes said rotating means rotate said object to be treated without supplying a rinsing solution to said object to thereby dry said object to be treated.

4. The method according to claim 3, wherein an acceleration speed of said object to be treated at the time of centrifugally removing said treatment solution is lower than an acceleration speed of said object treated at the time of drying said object to be treated.

5. The method according to claim 1, wherein in said developing treatment apparatus which further comprises gas sucking means for said gas sucking means to suck and remove a gas surrounding said object to be processed, said method for developing treatment further comprises a step that said control means makes said gas sucking means stop sucking during a period while said treatment solution is being worked to said object to be processed by leaving said object supplied with said treatment solution for a predetermined period of time.

6. The method according to claim 1, wherein said treatment solution includes a surfactant.

7. The method according to claim 1, wherein said nozzle has a plurality of discharge ports for discharging said pure water and/or said treatment solution and said plurality of discharging ports are arranged in a straight line.

8. A method for developing treatment in which a developing solution is supplied to an object to be treated for performing a developing treatment using a developing treatment apparatus comprising a nozzle for supplying said treatment solution and a pure water to an object to be treated, nozzle moving means for moving said nozzle between a first position as a starting point and a second position for supplying said treatment solution and said pure water to said object to be treated, treatment solution supply means for supplying said treatment solution to said nozzle, pure water supply means for supplying said pure water to said nozzle and control means for controlling the operation of said nozzle moving means, said treatment solution supply means and said pure water supply means, comprising the steps of:

said control means making said nozzle moving means move said nozzle from a first position to a second position in WAIT mode;

said control means changing a control mode of said nozzle from a WAIT mode to a NON-WAIT mode;

said control means making said pure water supply means supply said pure water to said nozzle to supply pure water from said nozzle onto the surface of said object to be treated so as to form a curtain of a pure water between the surface of said object to be treated and said nozzle; and said control means making said treatment solution supply means supply said treatment solution to said nozzle to supply said treatment solution from said nozzle.

9. The method according to claim 8, wherein said developing treatment apparatus further comprises rotating means for rotating an object to be treated and said control means further comprises a step for making said rotating means to rotate said object to be treated which has said curtain of a pure water formed thereon.

10. The method according to claim 9, wherein said developing treatment apparatus further comprises rotating means for rotating an object to be treated and rinsing solution supply means for supplying a rinsing solution onto the surface of said object to be treated and said method for developing treatment further comprises a step that said control means makes said rotating means rotate said object to be treated while making said rinsing solution supply means supply said rinsing solution to said object to be treated to which said treatment solution has been supplied, to thereby centrifugally remove said treatment solution from said object to be treated, and then makes said rotating means rotate said object to be treated without supplying a rinsing solution to said object to thereby dry said object to be treated.

11. The method according to claim 10, wherein an acceleration speed of said object to be treated at the time of centrifugally removing said treatment solution is lower than an acceleration speed of said object treated at the time of drying said object to be treated.

12. The method according to claim 8, wherein in said developing treatment apparatus which further comprises gas sacking means for said gas sucking means to suck and remove a gas surrounding said object to be processed, said method for developing treatment further comprises a step that said control means makes said gas sacking means stop absorbing during a period while said treatment solution is being worked to said object to be processed by leaving said object supplied with said treatment solution for a predetermined period of time.

13. The method according to claim 8, wherein said treatment solution includes a surfactant.

14. The method according to claim 8, wherein said nozzle has a plurality of discharge ports for discharging said pure water and/or said treatment solution and said plurality of discharging ports are arranged in a straight line.

15. A method for developing treatment, in which a developing solution is supplied to a substrate coated with a resist film exposed to light to form a pattern for performing a developing treatment, comprising;

(a) providing a common nozzle for supplying a developing solution and pure water and positioning said common nozzle in the vicinity of a substrate;

(b) rotating said substrate on an axis thereof;

(c) supplying pure water from said common nozzle onto the substrate to form a curtain of pure water joining said resist film to the common nozzle; and (d) introducing a developing solution into said curtain of pure water to bring said developing solution into contact with the resist film covered with pure water.

16. The method according to claim 15, further comprising the step of rotating the substrate while said step (d) is performed.

17. The method according to claim 15, further comprising the step of providing a surfactant in said developing solution.

18. The method according to claim 15, further comprising the step of providing said common nozzle with a plurality of spurting ports, which are linearly arranged, for spurting the pure water and developing solution.

\* \* \* \* \*